United States Patent
Lee et al.

(10) Patent No.: US 8,218,360 B2
(45) Date of Patent: Jul. 10, 2012

(54) PHASE-CHANGE AND RESISTANCE-CHANGE RANDOM ACCESS MEMORY DEVICES AND RELATED METHODS OF PERFORMING BURST MODE OPERATIONS IN SUCH MEMORY DEVICES

(75) Inventors: Kwang-Jin Lee, Gyeonggi-do (KR); Young-kug Moon, Gyeonggi-do (KR); Young-pil Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 323 days.

(21) Appl. No.: 12/582,880

(22) Filed: Oct. 21, 2009

(65) Prior Publication Data
US 2010/0124102 A1 May 20, 2010

(30) Foreign Application Priority Data
Nov. 17, 2008 (KR) .................. 10-2008-0114031

(51) Int. Cl.
*G11C 11/00* (2006.01)
*G11C 7/00* (2006.01)
(52) U.S. Cl. ............... 365/163; 365/148; 365/189.15; 365/205
(58) Field of Classification Search .............. None
See application file for complete search history.

(56) References Cited

U.S. PATENT DOCUMENTS
| | | | | |
|---|---|---|---|---|
| 4,520,439 A | * | 5/1985 | Liepa | 711/201 |
| 2006/0077746 A1 | * | 4/2006 | Sivero et al. | 365/230.06 |
| 2006/0174066 A1 | * | 8/2006 | Bridges et al. | 711/125 |

FOREIGN PATENT DOCUMENTS
| | | |
|---|---|---|
| JP | 2005-158199 | 6/2005 |
| KR | 1020010070007 A | 7/2001 |
| KR | 1020060007115 A | 1/2006 |

* cited by examiner

*Primary Examiner* — Hoai V Ho
*Assistant Examiner* — James G Norman
(74) *Attorney, Agent, or Firm* — Myers Bigel Sibley & Sajovec (57) ABSTRACT

Phase-change and resistance-change random access memory devices are provided which include a phase-change or resistance-change memory cell array and a sense amplifier that is configured to amplify data read from the phase-change memory cell array. These random access memory devices are configured to read data from a first word line of the phase-change or resistance-change memory cell array and to insert a dummy burst in which no data is read when a first boundary crossing occurs during a burst mode operation. Related methods of operating phase-change and/or resistance-change random access memory devices in burst mode are also provided.

16 Claims, 10 Drawing Sheets

| Starting Address Group for Burst Read | The Residue of (Address/8) | LSB Bits of Address | Additional Clock Cycles for First Word Boundary Crossing |
|---|---|---|---|
| 8N | 0 | 000 | 0 cycle |
| 8N+1 | 1 | 001 | 1 cycle |
| 8N+2 | 2 | 010 | 2 cycles |
| 8N+3 | 3 | 011 | 3 cycles |
| 8N+4 | 4 | 100 | 4 cycles |
| 8N+5 | 5 | 101 | 5 cycles |
| 8N+6 | 6 | 110 | 6 cycles |
| 8N+7 | 7 | 111 | 7 cycles |

PHASE-CHANGE AND RESISTANCE-CHANGE RANDOM ACCESS MEMORY DEVICES AND RELATED METHODS OF PERFORMING BURST MODE OPERATIONS IN SUCH MEMORY DEVICES

CROSS-REFERENCE TO RELATED APPLICATION

This application claims the benefit under 35 U.S.C. §119 of Korean Patent Application No. 10-2008-0114031, filed Nov. 17, 2008, in the Korean Intellectual Property Office, the disclosure of which is incorporated herein in its entirety by reference.

BACKGROUND

The present invention relates to semiconductor memory devices and, more particularly, to phase-change and resistance-change random access memory devices.

Phase-change Random Access Memory (PRAM) devices are a type of non-volatile memory that stores data using a material (hereinafter a "phase-change material") that has a resistance that varies as the phase of the material changes in response to temperature variations. An example of such a phase-change material is Ge—Sb—Te (GST). PRAM devices include many of the advantages of Dynamic Random Access Memory (DRAM) devices and are also non-volatile memories that exhibit low-power consumption. Because of these advantageous characteristics, PRAM devices may be widely used in the future.

SUMMARY

Pursuant to embodiments of the present invention, phase-change random access memory (PRAM) devices and resistance-change random access memory devices are provided that can read data without degradation in performance, even when a boundary crossing occurs.

According to some embodiments of the present invention, random access memory (RAM) devices are provided that include first and second memory cell arrays, and first and second sense amplifiers that amplify data read from the respective first and second memory cell arrays. These random access memory devices are configured so that when a boundary crossing occurs when data is being read in a burst mode operation, the random access memory device activates both a word line of the first memory cell array and a word line of the second memory cell array and reads data from the first memory cell array in response to activation of the word line of the first memory cell array and then reads data from the second memory cell array in response to activation of the word line of the second memory cell array.

In some embodiments, the random access memory device may be configured to activate the word line of the first memory cell array and the word line of the second memory cell array substantially together whenever a boundary crossing occurs during the burst mode operation. Additionally, the random access memory device may be configured activate a single word line of either the first memory cell array or the second memory cell array when a boundary crossing does not occur during the burst mode operation. The data may be read in units of N words, where N is a natural number, when a boundary crossing does not occur during the burst mode operation. In contrast, when a boundary crossing occurs during the burst mode operation, the data may be read in units of K words, where K is a natural number smaller than N, as the word line of the first memory cell array is activated, and then the data is read in units of N words as the word line of the second memory cell array is activated. In some embodiments, the random access memory device is a phase-change random access memory device, and the first and second memory cell arrays are first and second phase-change memory cell arrays.

According to further embodiments of the present invention, RAM devices are provided that include a memory cell array and a sense amplifier that is configured to amplify data read from the memory cell array. These random access memory devices may be configured to read data from a first word line of the memory cell array and to insert a dummy burst in which no data is read when a first boundary crossing occurs during a burst mode operation.

In some embodiments, the random access memory device may be configured to read K bits of data from the first word line, and may be configured to make the length of the dummy burst N-K bits (where K is a natural number smaller than N). These devices may further be configured to activate a second word line and read N bits of data therefrom after reading data from the first word line and the dummy burst. In certain embodiments, the random access memory device may be configured to insert the dummy burst before reading the K bits of data from the first word line. In other embodiments, the random access memory device may be configured to insert the dummy burst after reading the K bits of data from the first word line.

The random access memory device may be configured to read N bits of data from each of the two word lines involved in a second boundary crossing that occurs during the burst mode operation without inserting a second dummy burst. Moreover, the random access memory device may be configured to read data in units of N bits in the burst mode operation in the absence of a boundary crossing. In some embodiments, the random access memory device is a phase-change random access memory device, and the first and second memory cell arrays are first and second phase-change memory cell arrays.

Pursuant to still further embodiments of the present invention, methods of reading data from a random access memory device operating in a burst mode that includes at least a first boundary crossing are provided. Pursuant to these methods, a first word line of a memory cell array of the random access memory device is activated, and then K bits of data are read from this activated first word line. A dummy burst having a length of N-K clock cycles is inserted either before or after the data is read from the first word line. No data is read during this dummy burst. A second line of the memory cell array is activated, and then N bits of data are read from second activated word line, where N is greater than K.

In these methods, the boundary crossing may be located between the last of the K bits of data read from the activated first word line and the first of the N bits of data read from the second activated word line. These methods may further include reading data from a third word line of the memory cell array during the burst mode without inserting a dummy burst at the boundary crossing between the second word line and the third word line

BRIEF DESCRIPTION OF THE DRAWINGS

Exemplary embodiments of the present invention will be more clearly understood from the following detailed description taken in conjunction with the accompanying drawings in which.

DETAILED DESCRIPTION OF THE EMBODIMENTS

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 1:
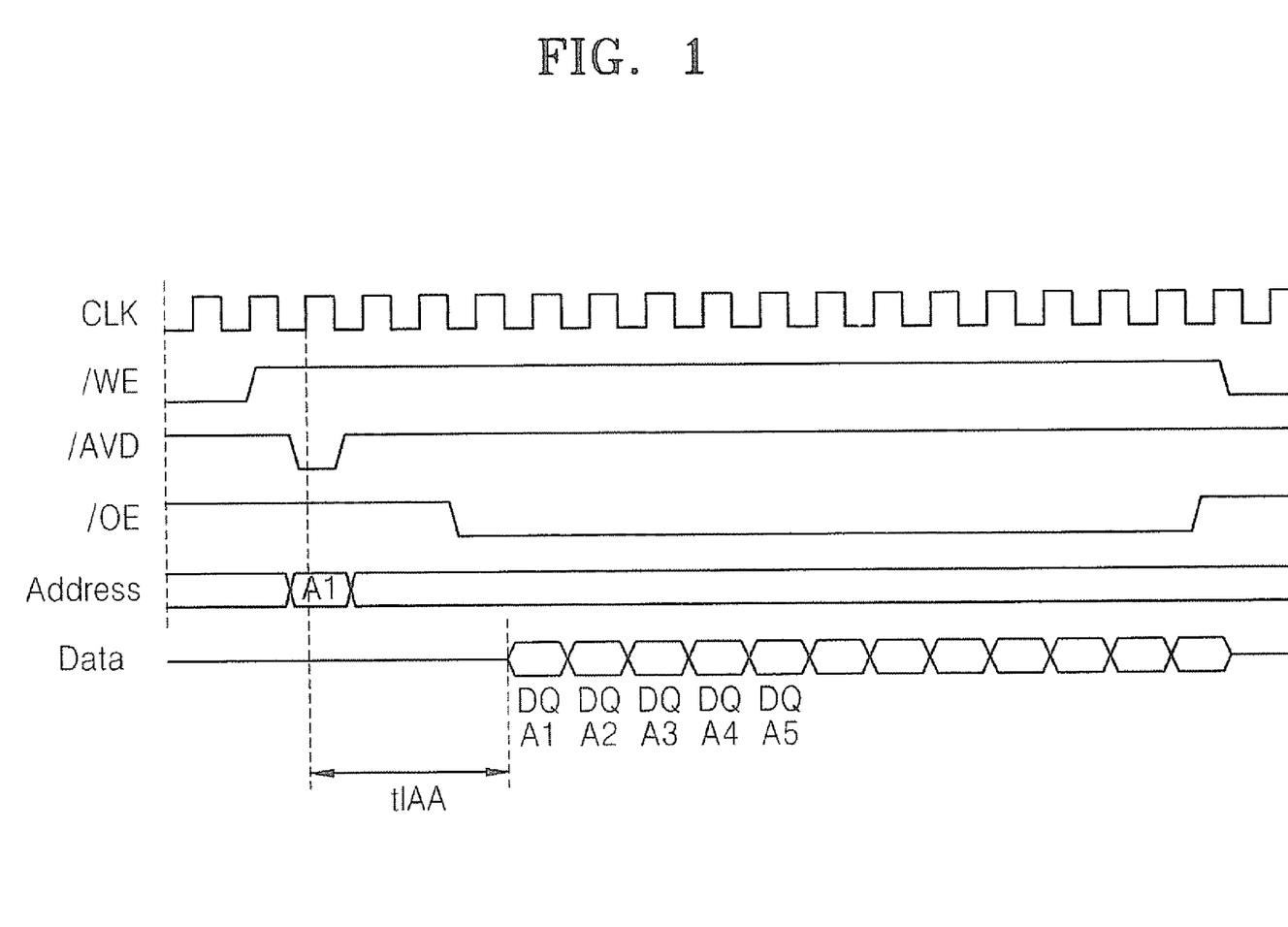
FIG. 1 is a timing diagram that illustrates the timing of a synchronous read operation of a memory device that is performed in a burst mode.

FIG. 1 is a timing diagram that illustrates the timing of a synchronous read operation of a memory device that is performed in a burst mode.

As shown in FIG. 1, a write enable signal /WE is brought to a high level. Thereafter, an address input enable signal /AVD is brought to a low level for a clock cycle. In response to the address input enable signal being brought to a low level, an address A1 is received. Thereafter, an output enable signal /OE is brought to a low level. After a latency period tlAA passes from receipt of the address A1, a synchronous read operation is performed in which data DQA1~DQA5 is sequentially read during a respective period of five cycles of the clock CLK. A read mode (such as is shown in FIG. 1) in which a predetermined number of pieces of data DQA1~DQA5 are sequentially read in synchronization with a continuous clock cycle is referred to as a burst mode. In burst mode, the semiconductor memory device can operate at a high speed.

However, when operating in burst mode, a phenomena known as a "boundary crossing" may occur. A "boundary crossing" refers to an address transition from the last memory cell connected to a first word line to a first memory cell connected to a second word line.

Figure 2:
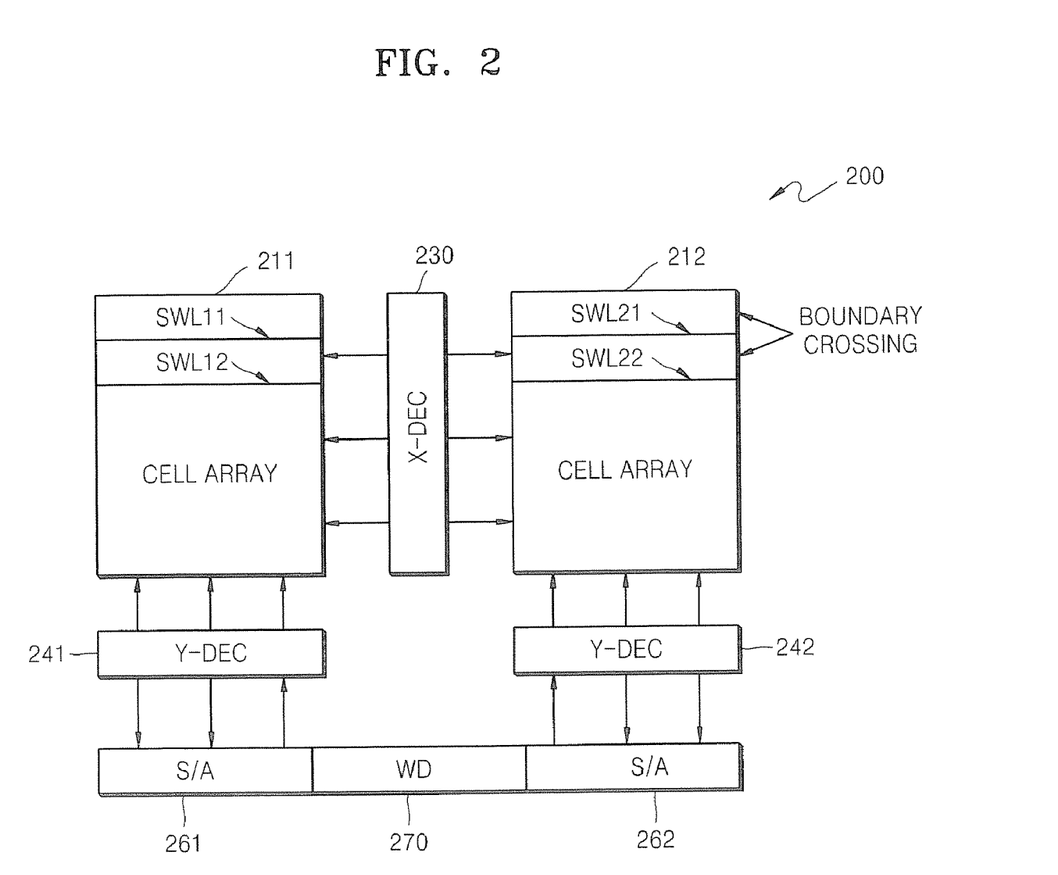
FIG. 2 is a block diagram of a PRAM device according to certain embodiments of the present invention.

FIG. 2 is a block diagram of a PRAM device 200 according to certain embodiments of the present invention.

The PRAM device 200 of FIG. 2 includes a first phase-change memory cell array 211, a second phase-change memory cell array 212, a first sense amplifier (S/A) 261, and a second sense amplifier (S/A) 262. In addition, the PRAM device 200 of FIG. 2 may further include an X-decoder (X-DEC) 230, a first Y-decoder (Y-DEC) 241, a second Y-decoder (Y-DEC) 242, and a write driver (WD) 270.

Each of the first and second phase-change memory cell arrays 211 and 212 includes a plurality of phase-change memory cells. The first sense amplifier 261 amplifies the data read from the first phase-change memory cell array 211. The second sense amplifier 262 amplifies the data read from the second phase-change memory cell array 212. The X-decoder 230 selects one of the word lines (e.g., SWL11) of the first phase-change memory cell array 211 and one of word lines (e.g., SWL21) of the second phase-change memory cell array 212.

The first Y-decoder 241 and the second Y-decoder 242 select columns of the first phase-change memory cell array 211 and the second phase-change memory cell array 212, respectively. The write driver 270 controls write operations to the first phase-change memory cell array 211 and to the second phase-change memory cell array 212.

Figure 3:
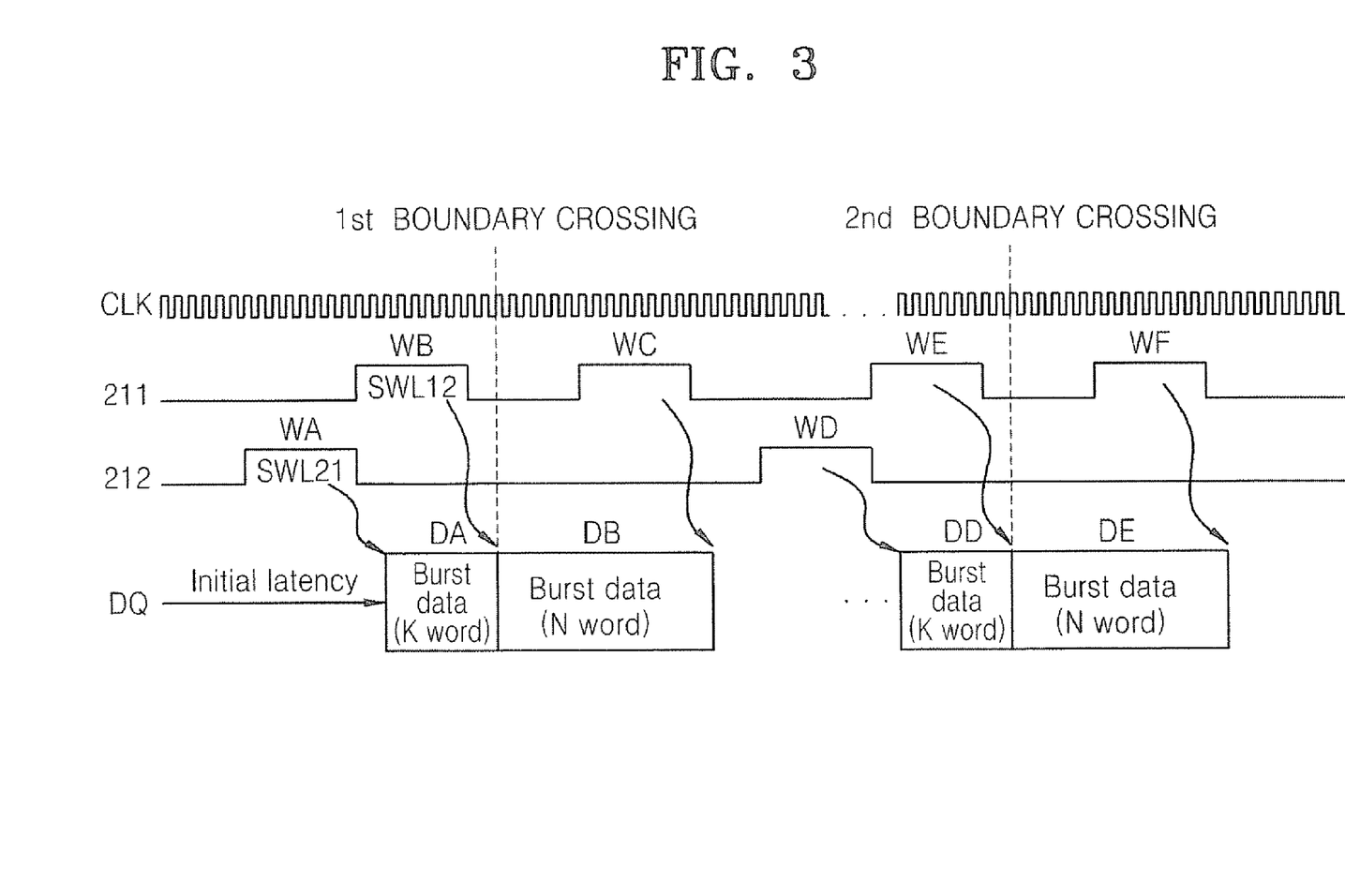
FIG. 3 is a timing diagram that illustrates the timing of a method of performing a burst mode synchronous read operation according to first embodiments of the present invention.

FIG. 3 is a timing diagram that illustrates the timing of a method of performing a burst mode synchronous read operation according to first embodiments of the present invention.

As shown in FIG. 3, in the methods according to the first embodiments of the present invention, a word line SWL12 of the first phase-change memory cell array 211 and a word line SWL21 of the second phase-change memory cell array 212 are activated substantially together when a boundary crossing occurs during a burst mode operation. In other words, when a boundary crossing occurs, the two word lines SWL12 and SWL21 that belong to the different first and second phase-change memory cell arrays 211 and 212 are activated at the same time or almost at the same time, as shown in FIG. 3.

As shown in FIG. 3, after an initial latency has passed from the activation of the word line SWL21 (WA in FIG. 3), data of K words (K is a natural number smaller than N) are read (DA in FIG. 3). Next, data of N words are read (DB in FIG. 3) as the word line SWL12 is activated (WB in FIG. 3). In the example of FIG. 3 (as well as in the embodiments described herein with respect to FIGS. 5, 7 and 8), it is assumed that data are read in units of N words (N is a natural number) in the burst mode.

Two word lines can be activated whenever a boundary crossing occurs in the burst mode (see DD, DE; WD, WE in FIG. 3). In contrast, when the memory device is operating in the burst mode and a boundary crossing does not occur, a word line of only one of the first phase-change memory cell array 211 and the second phase-change memory cell array 212 is activated.

Figure 4:
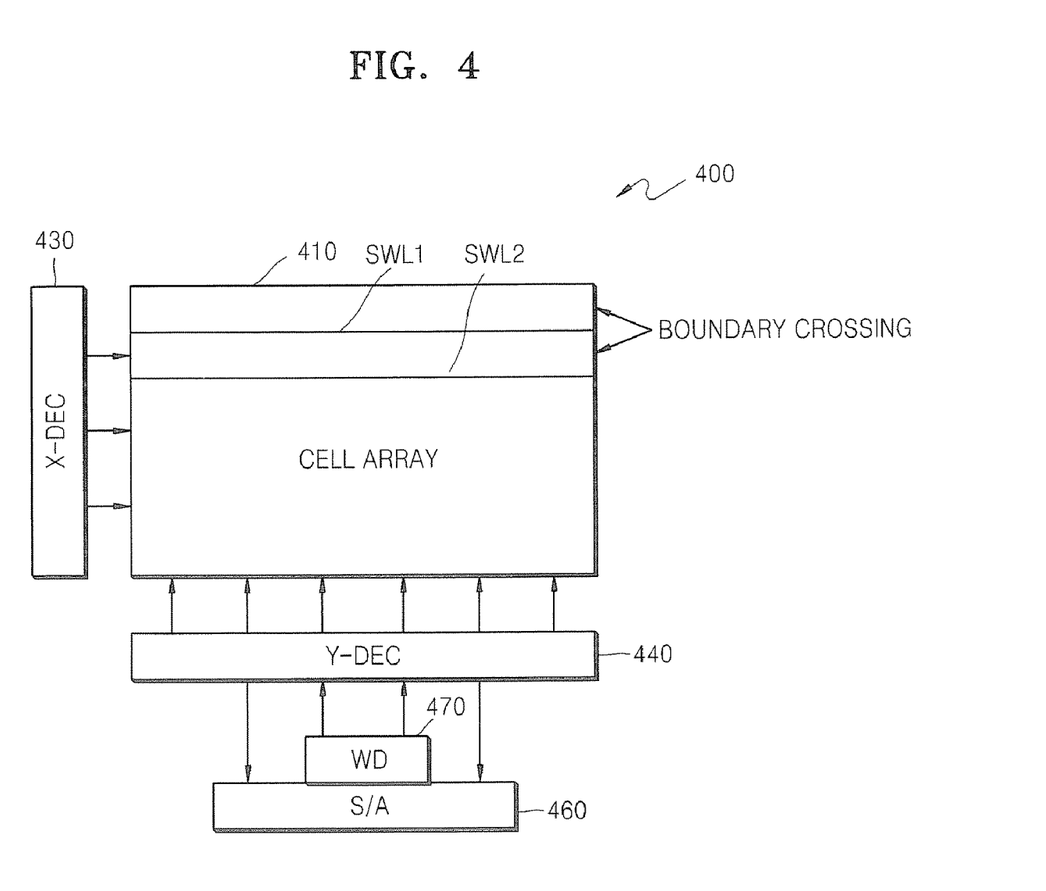
FIG. 4 is a block diagram of a PRAM device according to further embodiments of the present invention.

FIG. 4 is a block diagram of a PRAM device 400 according to further embodiments of the present invention.

The PRAM device 400 of FIG. 4 includes a phase-change memory cell array 410 and a sense amplifier (S/A) 460. The PRAM device 400 of FIG. 4 may further include an X-decoder (X-DEC) 430, a Y-decoder (Y-DEC) 440 and a write driver (WD) 470.

The phase-change memory cell array 410 includes a plurality of phase-change memory cells. The sense amplifier 460 amplifies the data read from the phase-change memory cell array 410. The X-decoder 430 selects one of the word lines (e.g., SWL1, SWL2) of the phase-change memory cell array 410. The Y-decoder 440 selects a column of the phase-change memory cell array 410. The write driver 470 controls write operations to the phase-change memory cell array 410.

Figure 5:
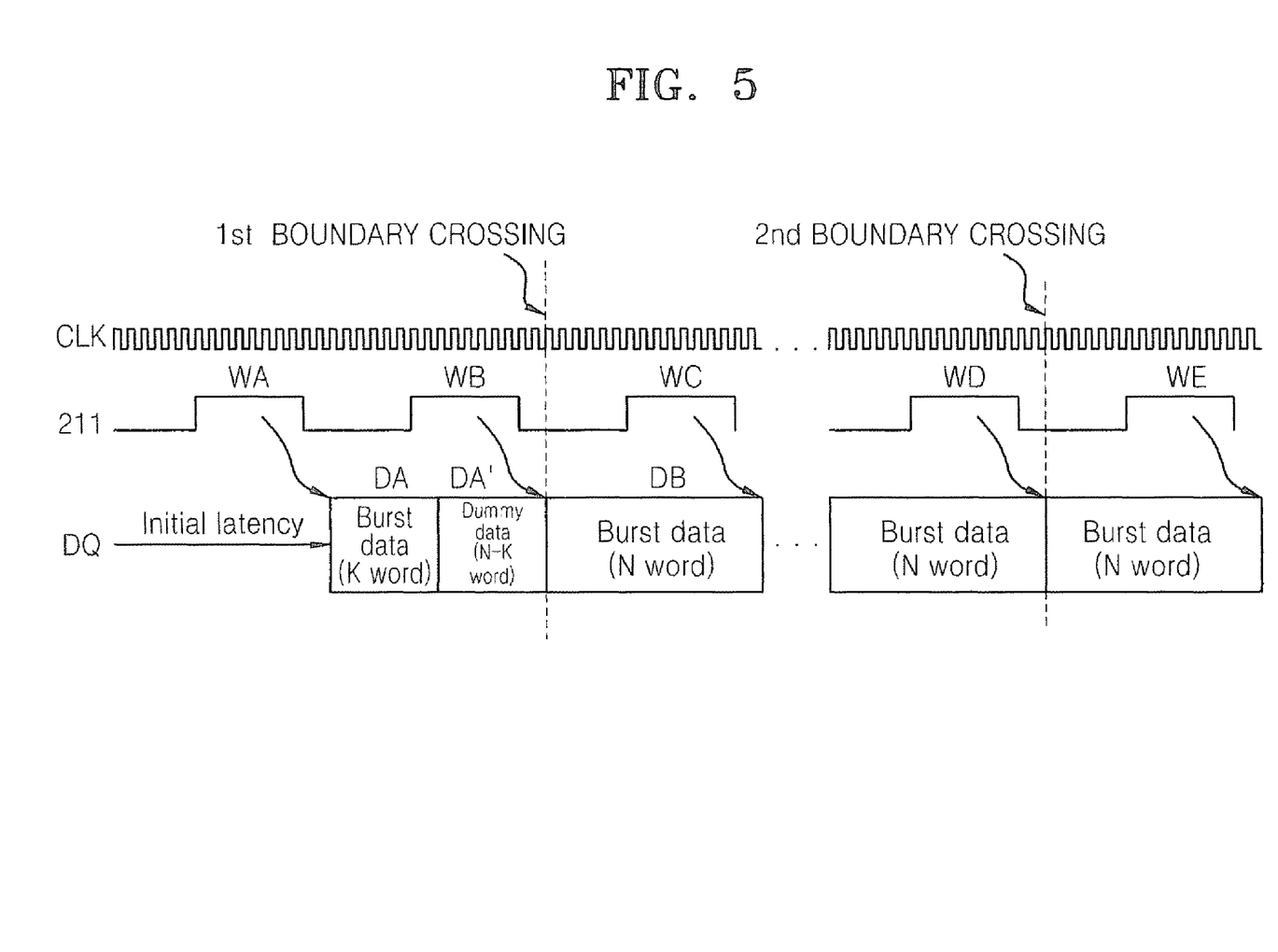
FIG. 5 is a timing diagram that illustrates the timing of a method of performing a burst mode synchronous read operation according to second embodiments of the present invention.

FIG. 5 is a timing diagram that illustrates the timing of a method of performing a burst mode synchronous read operation according to second embodiments of the present invention.

As shown in FIG. 5, in the methods according to the second embodiments of the present invention, when a boundary crossing occurs during a burst mode operation, data (DA in FIG. 5) is first read from a single activated word line (for example, SWL1 in FIG. 4) of the phase-change memory cell array 410 of FIG. 4. Then, a dummy burst is inserted (DA' in FIG. 5) during which no data is read. After the dummy burst, data (DB in FIG. 5) is read from another activated word line (for example, SWL2) of the phase-change memory cell array 410.

As shown in FIG. 5, after an initial latency has passed from the activation of the word line SWL1 of FIG. 4 (WA in FIG. 5), data of K words (K is a natural number smaller than N) is read (DA in FIG. 5). Next, a dummy burst of length N-K clock cycles occurs. Then, after the dummy burst, data of N words is read (DB in FIG. 5) as the word line SWL2 is activated (WB in FIG. 5). The dummy burst may be inserted only when a boundary crossing occurs for the first time during a burst mode operation. In other words, after a boundary crossing has occurred for the first time, data of N words can be normally read without inserting the dummy burst, as shown in FIG. 5 with respect to the second boundary crossing.

Figure 6:
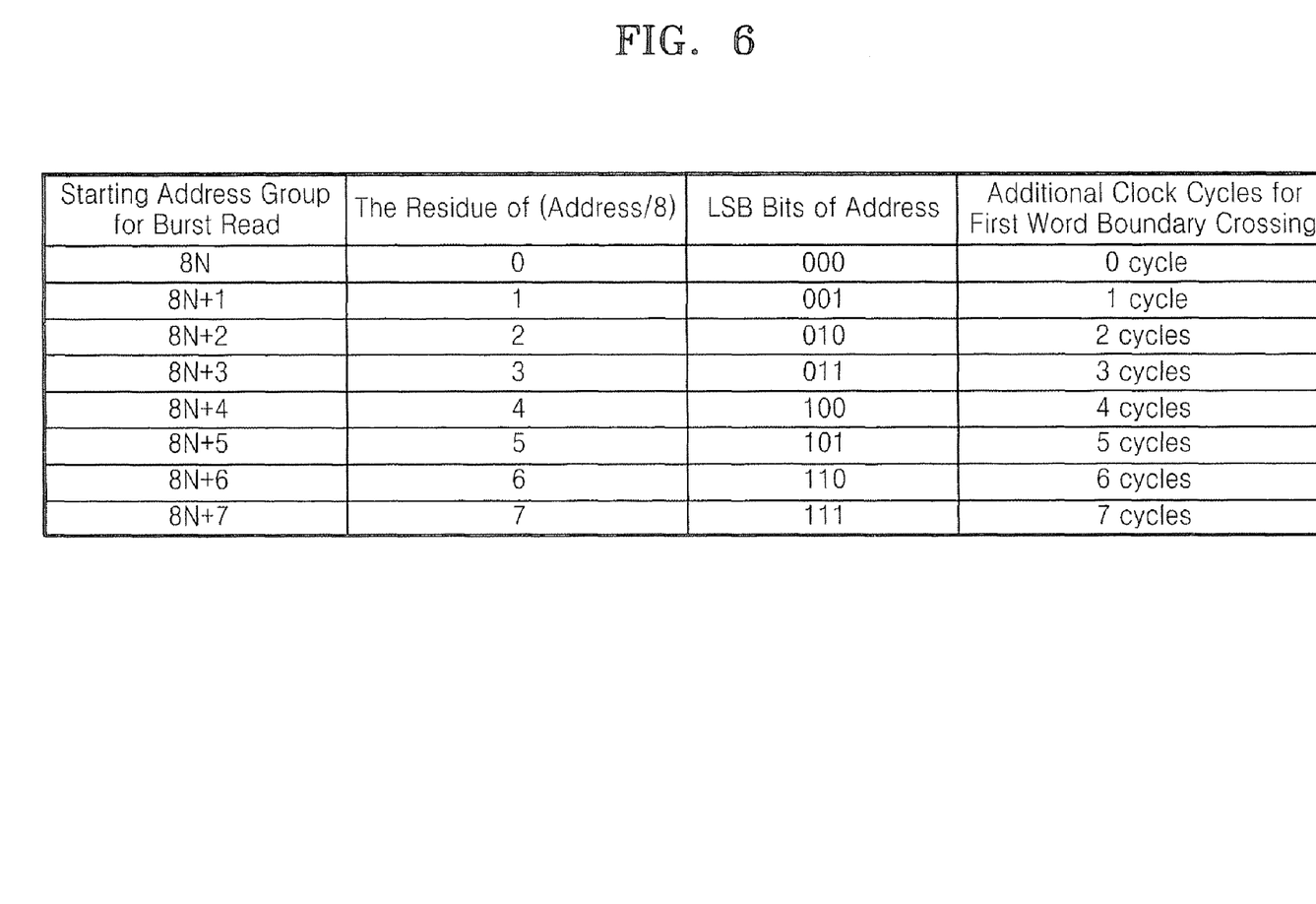
FIG. 6 is a table of the number of dummy cycles inserted in the dummy burst of FIG. 5.

FIG. 6 is a table of the number of clock cycles (also referred to as "dummy cycles") in the dummy burst that are inserted in the second mode in FIG. 5.

As shown in FIG. 6, the number of dummy cycles that are inserted varies according to the start address for the burst mode. For example, if the start address for the burst mode is 8N (N is a natural number), the number of inserted dummy cycles in the dummy burst is 0. If the start address for the burst mode is 8N+1, the number of inserted dummy cycles is 1.

The number of dummy cycles in the dummy burst may also vary according to the read rate of the phase-change memory cell array and/or the initial latency of the phase-change memory cell array.

Figure 7:
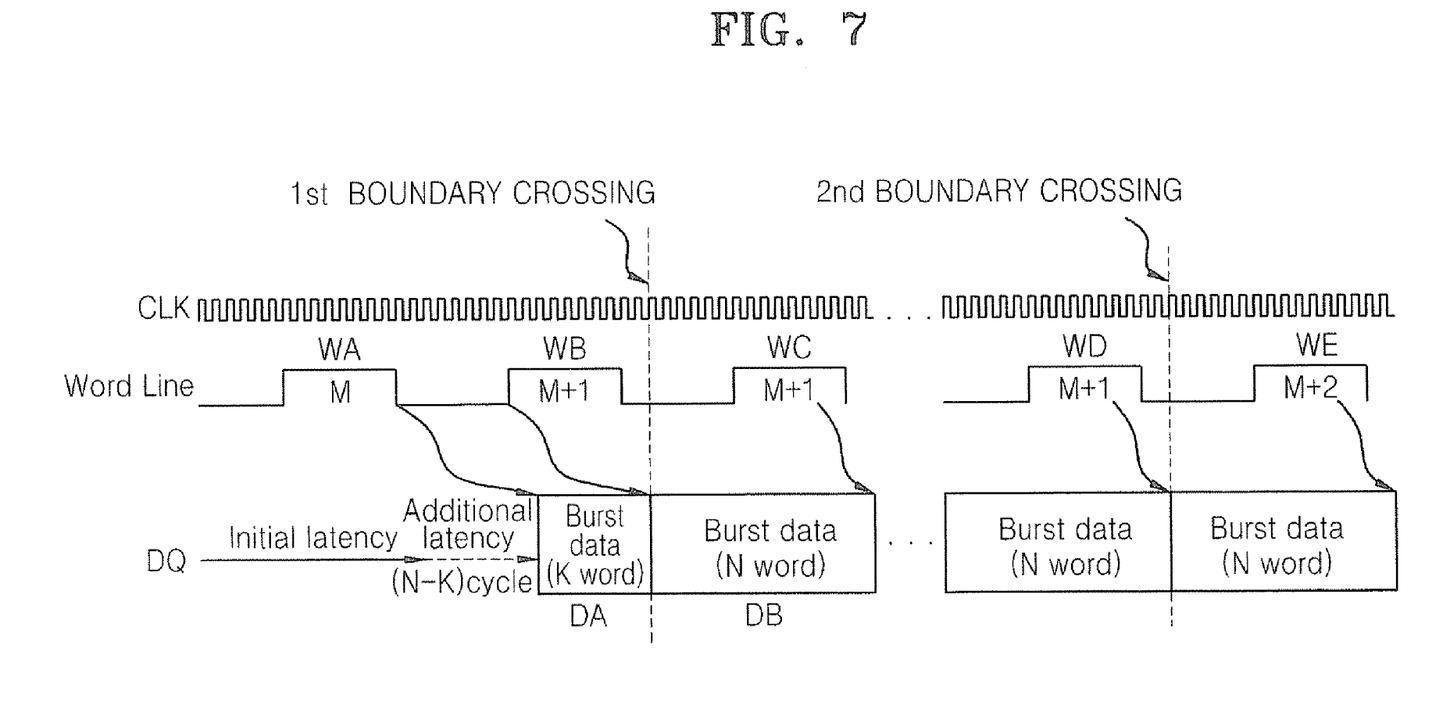
FIG. 7 is a timing diagram that illustrates the timing of a method of performing a burst mode synchronous read operation according to third embodiments of the present invention.

FIG. 7 is a timing diagram that illustrates the timing of a method of performing a burst mode synchronous read operation according to third embodiments of the present invention.

As shown in FIG. 7, according to these methods, after an initial latency has passed, a dummy burst (labeled "Additional latency" in FIG. 7) is inserted during which no data is read. Thus, in this embodiment, the latency period from the activation of a word line (WA in FIG. 7) until data is read (DA in FIG. 7) is extended by the length of the dummy burst.

After the latency period (i.e., the initial latency plus the additional latency), data is read (DA in FIG. 7) from a single activated word line (for example, SWL1) of the phase-change memory cell array 410. Next, data is read from the phase-change memory cell array 410 (DB in FIG. 7) as another word line (for example, SWL2) is activated. For example, in the third embodiment, after the latency period has passed, data of K words (K is a natural number smaller than N) is read (DA in FIG. 7). Then, data of N words is read (DB in FIG. 7) as the word line SWL2 is activated (WB in FIG. 7).

In the third embodiments, the dummy burst may only be inserted when a boundary crossing occurs for the first time during a burst mode operation. Consequently, for second and later occurrences of a boundary crossing during the burst mode operation, data of N words can be read normally without inserting the dummy burst. This is illustrated in FIG. 7 with respect to the activation of the word line WD in FIG. 7, where it is shown that data of N words is read after the activation of word line WD.

Figure 8:
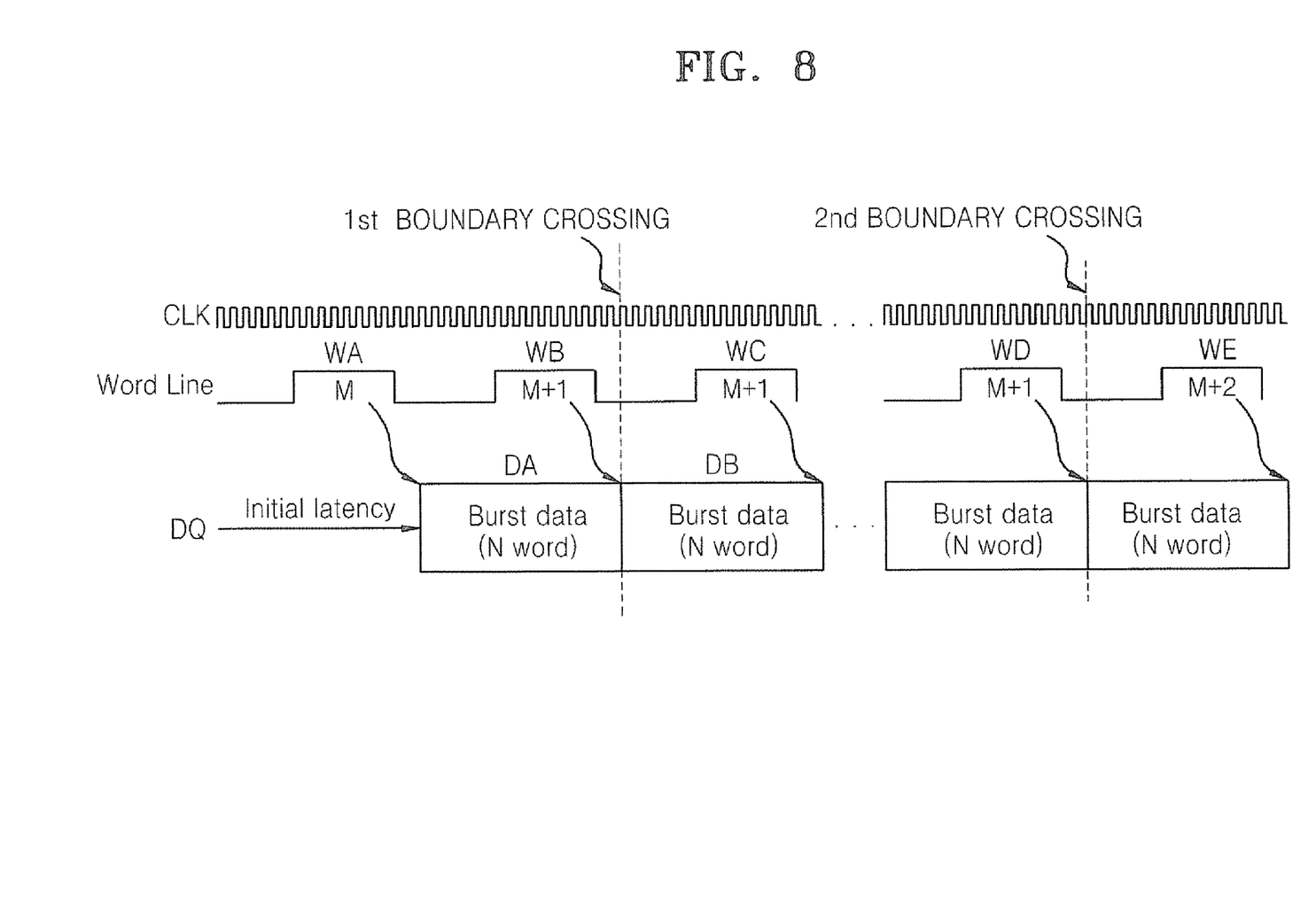
FIG. 8 is a timing diagram that illustrates the timing of a method of performing a burst mode synchronous read operation according to fourth embodiments of the present invention.

FIG. 8 is a timing diagram that illustrates the timing of a method of performing a burst mode synchronous read operation according to fourth embodiments of the present invention.

As shown in FIG. 8, in the methods according to the fourth embodiment, the read start address for the burst mode is fixed irrespective of the occurrence of a boundary crossing, and data is read from the phase-change memory cell array 410 in units of N words (where N is a natural number), in the burst mode. This is distinguished from the second and third embodiments that are discussed above in which data is read in units of K words (K is a natural number smaller than N) in the first occurrence of a boundary crossing, and then in units of N words thereafter. The methods of the fourth embodiment also differ from the methods of the second and third embodiments in that a dummy burst is not inserted in the methods of the fourth embodiment. In addition, the initial latency period is not varied in the methods of the fourth embodiment, whereas the initial latency period is extended in the methods of the third embodiment. The fourth embodiment may be used with phase-change memory devices that do not require burst random access.

The fourth embodiment may also be applied to large-capacity NAND data buffers that do not require random access, in addition to phase-change memory devices.

Figure 9:
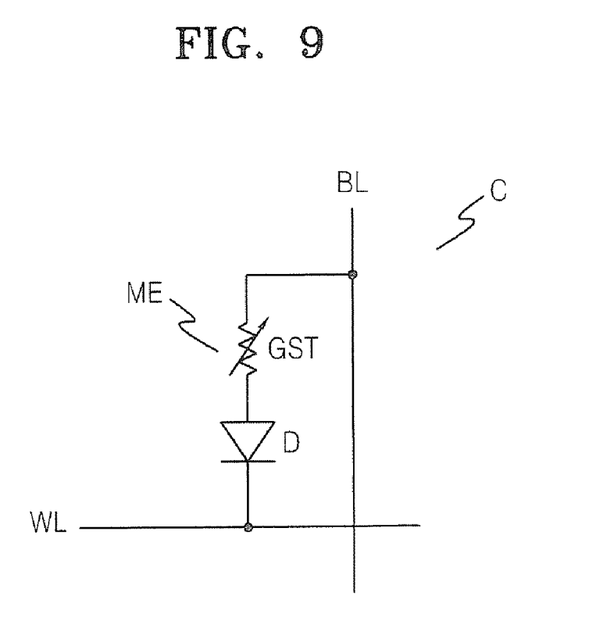
FIG. 9 is an equivalent circuit diagram of a diode-type PRAM cell that can be included in the PRAM cell arrays of FIGS. 2 and 4.

FIG. 9 is an equivalent circuit diagram of a diode-type phase-change memory cell that can be included in the PRAM devices of FIGS. 2 and 4.

In FIG. 9, the diode-type phase-change memory cell is denoted as C. The phase-change memory cell arrays of FIGS. 2 and 4 may include a plurality of diode-type phase-change memory cells, each of which may have the structure as illustrated in FIG. 9.

The diode-type phase-change memory cell (C) includes a memory device (ME) and a P-N diode (D). A phase-change material (Ge—Sb—Te; GST) is connected to a bit line BL, a P-junction of the diode (D). The N-junction of the diode (D) is connected to a word line WL.

The memory device (ME) contains the phase-change material (GST). The phase-change material (GST) in the diode-type phase-change memory cell (C) may be in either a crystallized state or an amorphous state, depending on the temperature and heating time. The state of the phase-change material (GST) is used to denote the value of the data that is stored in the cell (C). To induce a change in the phase of the phase-change material (GST), a high temperature of 900° C. or higher is required. This high temperature can be obtained due to Joule heating induced by the current flowing through the diode-type phase-change memory cell (C).

Figure 10:
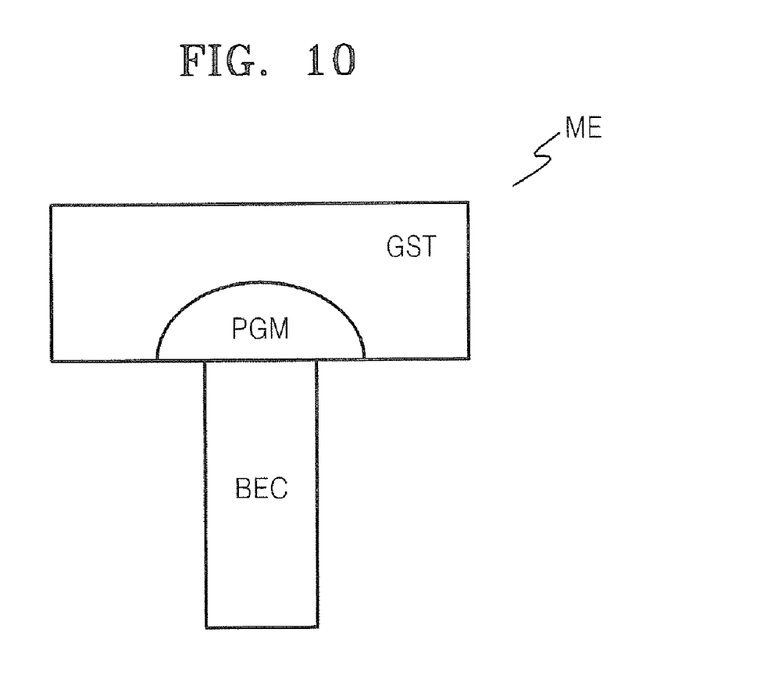
FIG. 10 is a schematic cross-sectional diagram of a memory device (ME) containing a phase-change material (GST, Ge—Sb—Te) of FIG. 9.

FIG. 10 is a schematic cross-sectional diagram of the memory device (ME) containing the phase-change material (GST) of FIG. 9.

Referring to FIG. 10, when current that is generated as described above is supplied to a lower electrode (BEC) of the memory device (ME), the volume and phase of a site (PGM) in the phase-change material (GST) that contacts the lower electrode (BEC) changes. This change affects the crystalline condition of the phase-change material GST.

Figure 11:
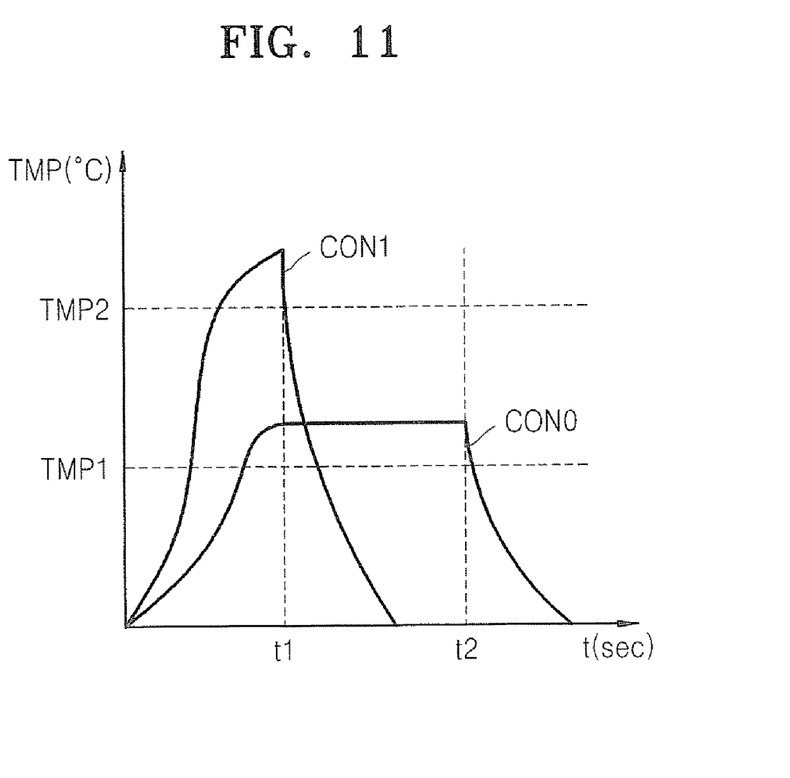
FIG. 11 is a graph showing characteristics of the phase-change material (GST) used in FIGS. 9 and 10.

FIG. 11 is a graph showing characteristics of the phase-change material (GST) used in FIGS. 9 and 10. In FIG. 11, the graph denoted as "CON1" shows a condition for the phase-change material (GST) to change to the amorphous state, and the graph denoted as "CON0" shows a condition for the phase-change material (GST) to change to the crystalline state. The write and read operations in a PRAM device will be described below with reference to FIGS. 9 through 11.

The write operation is performed as follows. To store information "1", the phase-change material (GST) is heated for a period of time (t1) to a melting temperature (TMP2) or higher and then rapidly cooled, so that the phase-change material (GST) changes to the amorphous state. This amorphous state is defined as information "1". The amorphous state is also referred to as the "Reset" state. To store information "1", the phase-change material (GST) is heated to a crystallization temperature (TMP1) or higher, maintained at the same temperature for a period of time (t2), and then slowly cooled. As a result, the phase-change material (GST) changes to the crystalline state. This state is defined as information "0". The crystalline state is also referred to as the "Set" state.

Next, for the read operation, a phase-change memory cell (C) to be read is selected by the selection of its corresponding bit line (BL) and word line (WL). As a read current is supplied to the selected phase-change memory cell (C), the information "1" and "0" are distinguished from one another based on voltage variations according to the resistance of the phase-change material (GST).

Figure 12:
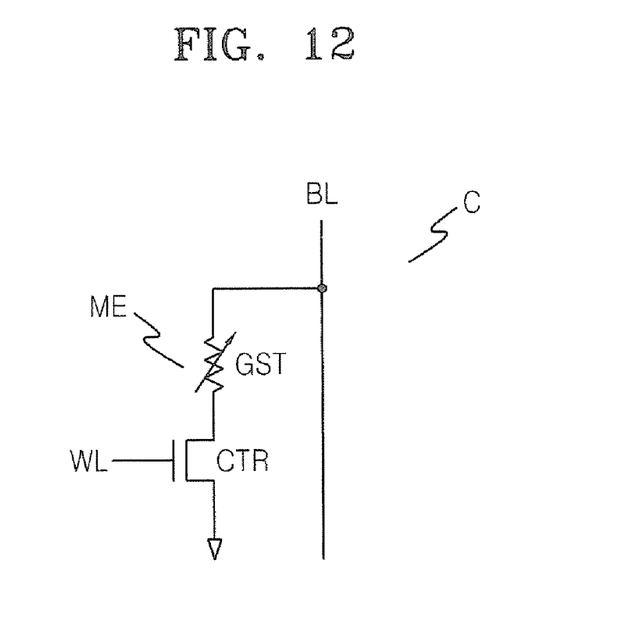
FIG. 12 is an equivalent circuit diagram of a metal-oxide-semiconductor (MOS) type phase-change memory cell that can be included in the phase-change memory cell arrays of FIGS. 2 and 4.

FIG. 12 is an equivalent circuit diagram of a metal-oxide-semiconductor (MOS) type phase-change memory cell that can be included in the phase-change memory cell arrays of FIGS. 2 and 4.

In FIG. 12, a single metal-oxide-semiconductor-type phase-change memory cell is shown. The phase-change memory cell arrays of FIGS. 2 and 4 may include a plurality of metal-oxide-semiconductor-type phase-change memory cells that may have the structure shown in FIG. 12.

According to further embodiments of the present invention, the phase-change memory cells in FIGS. 11 and 12 may be replaced with resistance-change memory cells. Examples of resistance-change memory cells include a magnetoresistive random access memory cell, a resistive random access memory cell, a Racetrack memory cell, and the like. The methods according to embodiments of the present invention described above with respect to FIGS. 3, 5, 7 and 8 may be applied to memory arrays that use such resistance-change memory cells, and the memory cell arrays in FIGS. 2 and 4 above may include such resistance0change memory cells instead of phase-change memory cells according to further embodiments of the present invention.

Thus, a burst operation method for a PRAM device according to some embodiments of the present invention involves reading data from a phase-change memory cell array as a single word line is activated, inserting a dummy burst for which no data is read, and then reading data from the phase-change memory cell array as another single word line is activated following the dummy burst when a boundary crossing occurs in the burst mode, as discussed above with reference to FIGS. 4, 5 and 6.

A burst operation method in a PRAM device according to further embodiments of the present invention involves inserting a dummy cycle for which no data is read after an initial latency period has passed, reading data from a phase-change memory cell array as a single word line is activated, and reading data from the phase-change memory cell array as another single word line is activated when a boundary crossing occurs in the burst mode, as discussed above with reference to FIGS. 4 and 7.

In the burst operation methods in a PRAM device described in the above embodiments of the inventive concept, when boundary crossing occurs again in the burst mode after the above-described operations, no longer the dummy cycle is inserted. In other words, without inserting the dummy cycle, data are read from the phase-change memory cell array as a single word line is activated, and then data are read from the phase-change memory cell array as another single word line is activated.

While the present invention has been particularly shown and described with reference to exemplary embodiments thereof, it will be understood that various changes in form and details may be made therein without departing from the spirit and scope of the following claims.

What is claimed is:

1. A random access memory device comprising:
   a memory cell array; and
   a sense amplifier that is configured to amplify data read from the memory cell array,
   wherein the random access memory device is configured to read data from a first word line of the memory cell array and to insert a dummy burst in which no data is read when a first boundary crossing occurs during a burst mode operation,
   wherein the random access memory device is configured to read K bits of data from the first word line, is configured to make the length of the dummy burst N-K bits, and is further configured to activate a second word line and read N bits of data therefrom after reading data from the first word line and the dummy burst, and wherein K is a natural number smaller than N, and
   wherein the random access memory device is configured to insert the dummy burst before reading the K bits of data from the first word line.

2. A random access memory device comprising:
   a memory cell array; and
   a sense amplifier that is configured to amplify data read from the memory cell array,
   wherein the random access memory device is configured to read data from a first word line of the memory cell array and to insert a dummy burst in which no data is read when a first boundary crossing occurs during a burst mode operation, wherein the random access memory device is configured to read K bits of data from the first word line, is configured to make the length of the dummy burst N-K bits, and is further configured to activate a second word line and read N bits of data therefrom after reading data from the first word line and the dummy burst, and wherein K is a natural number smaller than N, and wherein the random access memory device is configured to read N bits of data from each of the two word lines involved in a second boundary crossing that occurs during the burst mode operation without inserting a second dummy burst.

3. The random access memory device of claim 1, wherein a number of dummy cycles included in the dummy burst varies according to a read rate of the memory cell array, an initial latency of the memory cell array, and/or a start address of the burst mode operation.

4. The random access memory device of claim 1, wherein the random access memory device is configured to read data in units of N bits in the burst mode operation in the absence of a boundary crossing.

5. The random access memory device of claim 1, wherein the memory cell array includes either a plurality of metal-oxide-semiconductor (MOS) type phase-change memory cells or a plurality of diode-type phase-change memory cells.

6. The random access memory device of claim 2, wherein the random access memory device is configured to read data in units of N bits in the burst mode operation in the absence of a boundary crossing.

7. The random access memory device of claim 2, wherein the memory cell array includes either a plurality of metal-oxide-semiconductor (MOS) type phase-change memory cells or a plurality of diode-type phase-change memory cells.

8. The random access memory device of claim 1, wherein the memory cell array comprises a phase-change memory cell array.

9. The random access memory device of claim 2, wherein the memory cell array comprises a phase-change memory cell array.

10. The random access memory device of claim 1, wherein the memory cell array includes a plurality of resistance-change memory cells.

11. The random access memory device of claim 2, wherein the memory cell array includes a plurality of resistance-change memory cells.

12. A method of operating a random access memory device that includes a memory cell array and a sense amplifier that is configured to amplify data read from the memory cell array, the method comprising:
   reading K bits of data from a first word line of the memory cell array;
   inserting a dummy burst of length N-K bits in which no data is read when a first boundary crossing occurs during a burst mode operation, where K is a natural number smaller than N; and
   activating a second word line and read N bits of data therefrom after reading data from the first word line and the dummy burst,
   wherein the dummy burst is inserted before reading the K bits of data from the first word line.

13. A random access memory device comprising:
   a memory cell array including a first word line and a second word line; and
   a sense amplifier that is configured to amplify data read from the memory cell array,
   wherein the random access memory device is configured to read data from the first word line of the memory cell array and to insert a dummy burst in which no data is read when a first boundary crossing occurs between the first word line and the second word line during a burst mode operation.

14. The random access memory device of claim 13, wherein the first boundary crossing refers to an address transition from a last memory cell connected to the first word line to a first memory cell connected to the second word line.

15. The random access memory device of claim 13, wherein the random access memory device is further configured to read data from the second word line of the memory cell array after inserting the dummy burst.

16. A random access memory device comprising:
   a memory cell array including a first word line and a second word line;
   a sense amplifier that is configured to amplify data read from the memory cell array;
      an X-decoder that is configured to select the first word line to read data from the first word line,
      wherein a dummy burst is inserted when a first boundary crossing occurs between the first word line and the second word line during a burst mode operation such that no data is read in the dummy burst, and
      wherein the X-decoder is further configured to select the second word line to read data from the second word line after the dummy burst is inserted.

* * * * *